United States Patent [19]

Kadlec

[11] Patent Number: 4,682,226
[45] Date of Patent: Jul. 21, 1987

[54] MONOSTABLE MULTIVIBRATOR FOR VIDEO DISPLAY

[75] Inventor: Joseph Kadlec, Berwyn, Ill.

[73] Assignee: Zenith Electronics Corporation, Glenview, Ill.

[21] Appl. No.: 632,778

[22] Filed: Jul. 20, 1984

[51] Int. Cl.$^4$ .............................................. H04N 5/04
[52] U.S. Cl. .................................... 358/148; 307/273
[58] Field of Search ............... 307/261, 265, 267, 273; 358/148, 158; 328/207, 193, 58

[56] References Cited

U.S. PATENT DOCUMENTS

| | | | |
|---|---|---|---|
| 3,469,116 | 10/1969 | Nomura | 307/273 |
| 3,479,529 | 11/1969 | van Dine | 307/273 |
| 3,719,835 | 3/1973 | Eberhard | 307/273 |
| 4,253,117 | 2/1981 | Kadlec | 358/158 |
| 4,544,852 | 10/1985 | Moosmann et al. | 307/261 |

Primary Examiner—Tommy P. Chin
Assistant Examiner—David E. Harvey

[57] ABSTRACT

A monostable multivibrator provides accurate control of a timed output signal relative to an input pulse provided thereto. A pulse width control circuit of the multivibrator having a variable resistor is coupled to an RC circuit for controlling the extent to which a capacitor therein is charged without affecting the circuit's RC time constant. The rate of discharge of the timing capacitor thus remains unchanged resulting in a substantially constant discharge slope over a range of time delays. In addition, the duty cycle of the multivibrator may be varied over a wide range by merely changing the value of a single resistor therein which also does not affect the discharge rate of the multivibrator's timing circuit and thus does not introduce unwanted variations in the timing of the output pulse.

8 Claims, 1 Drawing Figure

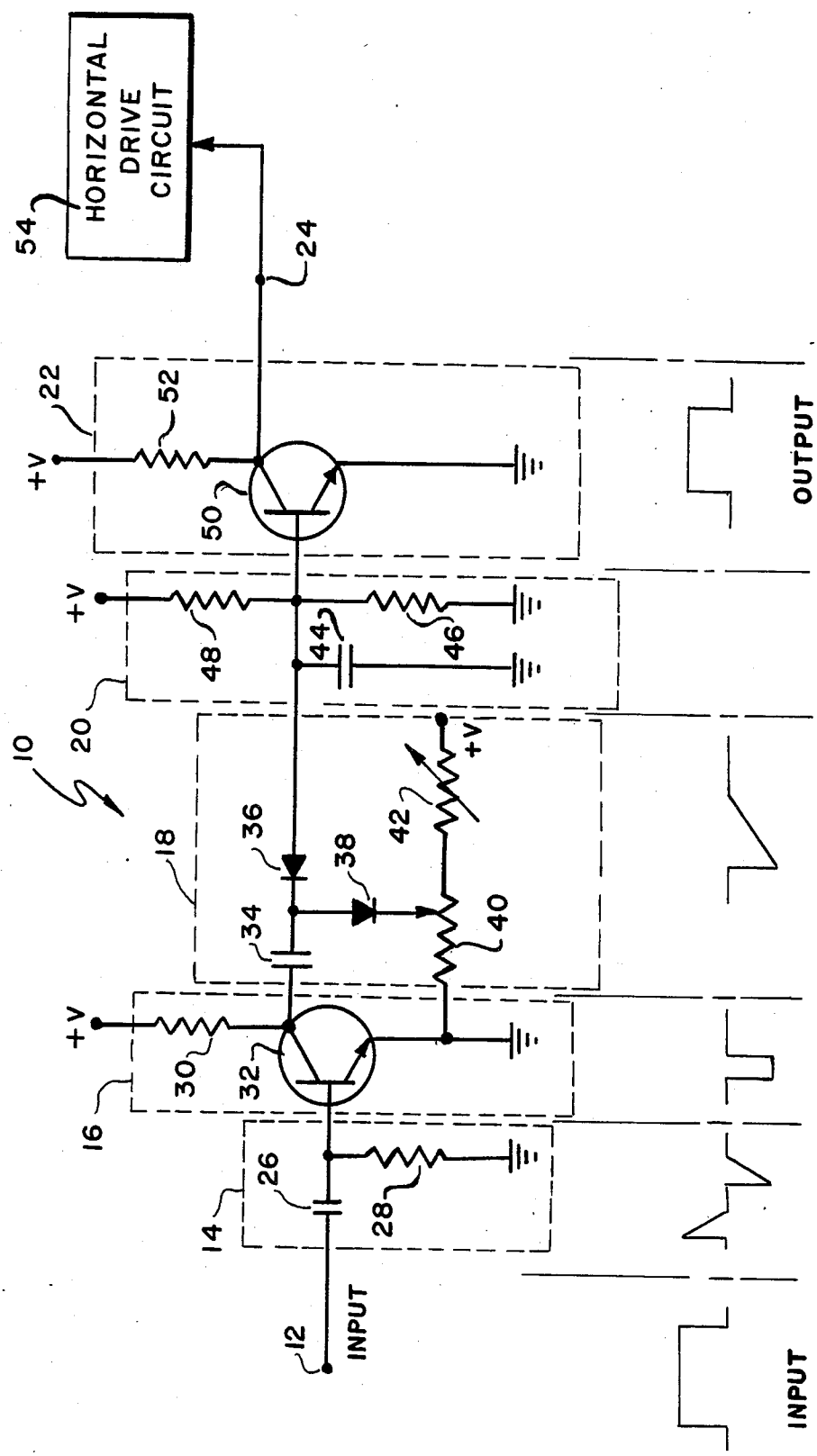

MONOSTABLE MULTIVIBRATOR FOR VIDEO DISPLAY

BACKGROUND OF THE INVENTION

This invention relates generally to electronic timing circuitry and is particularly directed to accurately controlling the occurrence of an output signal from a timing circuit generated in response to an input signal provided thereto.

The timing of various signals in an electronic circuit is generally critical for its proper operation, particularly when used in digital applications. For example, the timing between a first input signal and a second output signal is frequently of the utmost importance with regard to the proper operation of the system in which the two signals are utilized. Defining and maintaining proper timed relation between the two signals is frequently referred to as "synchronizing" the two signals which may ideally occur substantially simultaneously or with a predetermined, well-defined interval therebetween.

One area in which signal synchronization is of critical importance is in the processing and display of video information on a raster scanned cathode ray tube (CRT) in a conventional television receiver. One approach to signal sychronization in a television receiver utilizes a phase locked loop in which a phase detector has horizontal rate synchronizing pulses applied to one input and ramp signals related to horizontal deflection within the CRT applied to the other input. The phase detector responds to these inputs and produces control pulses which are filtered and used to control a horizontal-rate oscillator at a frequency which is an average of the incoming synchronizing signals. The horizontal oscillator in turn drives a horizontal deflection generator producing recurrent trace pulses which are integrated to produce the recurrent ramp or sawtooth signal input to the phase detector. Operating limitations in a phase locked loop system arise, however, when input synchronization signals vary over a large frequency range. This variation of input synchronization signal frequency becomes a critical operating parameter when a video display is used in a non-television type of application. For example, a video display used in a computer terminal or in a data display system may be required to interface with a great variety of input synchronization signals.

An improved approach to the synchronization of horizontal sweep in a video display with video synchronization input pulses which avoids the limitations of a phase locked loop is the subject of U.S. Pat. No. 4,253,117 issued in the name of the present inventor. This approach makes use of a free-running astable multivibrator in the horizontal drive circuit of the video display in combination with a monostable multivibrator responsive to a horizontal drive or synchronization input signal for triggering the astable multivibrator in well-defined time relation with respect to the horizontal drive signal. Upon receipt of a synchronization signal the monostable multivibrator is driven to an unstable state in which it remains for a predetermined time. A reduction in synchronization input signal amplitude due to an input signal voltage cutoff threshold which reduces spurious multivibrator inputs is compensated for by coupling the synchronization input from the monostable multivibrator to the emitter and collector of both of the astable multivibrator's coupled transistors. This multivibrator combination, by increasing synchronization signal injection to the astable multivibrator, provides an increase in the synchronization signal frequency capture range of more than three times that previously available.

However, this approach, as well as other prior art multivibrator synchronization signal arrangements, is not without limitations. For example, prior art systems typically vary the delay between output signal generation and the receipt of the input signal by changing the RC time constant of a timing circuit in the multivibrator such as by including a potentiometer therein. This results in a change in the discharge rate of the monostable multivibrator's RC timing circuit and introduces unwanted variation in the triggering of the following stage. In addition, changing the multivibrator's time constant permits only limited variation of the circuit's duty cycle and thus limits the timing range of the output signal relative to the received input signal.

The present invention is intended to overcome the aforementioned limitations of the prior art by providing a monostable multivibrator which includes an RC timing circuit having a uniform time constant over a range of time delays and wherein the duty cycle may be varied over a range of from approximately 1% to 90% by changing the value of a single component therein.

OBJECTS OF THE INVENTION

Accordingly, it is an object of the present invention to provide more accurate timing in an electronic circuit.

It is another object of the present invention to provide for more accurate control of the phase of a timing signal output by an electronic circuit generated in response to an input signal provided thereto.

Yet another object of the present invention is to provide a monostable multibrator responsive to an input signal for more accurately controlling the timing of an output signal relative to the input signal.

Still another object of the present invention is to provide adjustable timing in a monostable multivibrator for controlling the output therefrom.

A further object of the present invention is to provide a monostable multivibrator having a plurality of means for controlling the timing of an output signal relative to an input signal provided thereto.

A still further object of the present invention is to facilitate varying the duty cycle of a monostable multivibrator over a wide range of values.

BRIEF DESCRIPTION OF THE DRAWING

The appended claims set forth those novel features which characterize the invention. However, the invention itself, as well as further objects and advantages thereof, will best be understood by reference to the following detailed description of a preferred embodiment taken in conjunction with the accompanying FIGURE wherein is shown a schematic diagram in combination with signal waveforms in various portions of a monostable multivibrator in accordance with the present invention.

DESCRIPTION OF THE PREFERRED EMBODIMENT

Referring to the FIGURE, there is shown a schematic diagram of a variable, non-feedback type monostable multivibrator 10 in accordance with a preferred embodiment of the present invention.

An input signal in the form of a pulse is provided to the input terminal 12. Where the monostable multivibrator 10 of the present invention is used in a horizontal deflection circuit for a video display, a synchronization pulse is provided to the input terminal 12 for the purpose of synchronizing the raster scan of the video display with the displayed video information. For proper picture framing, the frequency and phase of oscillation produced by the horizontal sweep system must be synchronized with the frequency and phase of the horizontal synchronization signal which is transmitted from the broadcast station for the case of received television signals or may be synthesized by a sync signal generator when the video display is used in a non-television type of application. For example, a video display used in a computer terminal or in a video display terminal may be required to interface with a great variety of input synchronization signals.

The input pulse delivered to the input terminal 12 is provided via a differentiator circuit 14 to the base of an NPN transistor 32 in an inverter amplifier 16. The differentiator 14 is comprised of a capacitor 26 and a grounded resistor 28 for generating monostable multivibrator trigger pulses in response to the leading edge of the input pulse.

The monostable multivibrator trigger pulses are provided to the base of the NPN transistor 32 which, in combination with biasing resistor 30 coupled to a +V voltage source, forms an inverter amplifier 16. The positive differentiated input to the base of NPN transistor 32 is inverted by the inverter amplifier 16 and is provided from the collector of the NPN transistor 32 to a pulse width control circuit 18. The pulse width control 18 includes a coupling capacitor 34 which is coupled in series with a first diode 36. Coupled between the coupling capacitor 34 and the first diode 36 and to ground via a variable resistor 40 is a second diode 38. The variable resistor 40 is further coupled to the +V voltage source via resisitor 42 which also may be variable in value. The second diode 38 serves as a clamping diode in establishing the negative pulse level of the output of the pulse width control 18 as determined by the value of the variable resistor 40.

The sawtooth-shaped negative output pulse from the pulse width control 18 is provided to a timing circuit 20 comprised of resistors 46 and 48 and grounded capacitor 44. Thus, capacitor 44 is charged via the first diode 36 to a negative voltage determined by the value of variable resistor 40. Resistor 48 is coupled to the +V voltage source, while resistor 46 is coupled to neutral ground potential.

The sawtooth-shaped output of the timing circuit 20 is provided to the base of an NPN transistor 50. NPN transistor 50 in combination with biasing resistor 52 which is coupled to the +V voltage source forms an output stage 22 for delivering a positive pulse via an output terminal 24 to a horizontal drive circuit 54. The discharge of grounded capacitor 44 renders the NPN transistor 50 non-conductive, with a positive pulse then provided to the horizontal drive circuit 54. The output pulse provided from the NPN transistor 50 ends with the complete discharge of capacitor 44 which is again charged via the first diode 36 by the clamp voltage established by the combination of the second diode 38 and variable resistor 40. The positive output of the NPN transistor 50 may be varied by changing the clamp potential across the second diode 38 by means of the variable resistor 40.

The RC time constant of the timing circuit 20 may be expressed as follows:

$$T = C_{44}\left(\frac{R_{46} R_{48}}{R_{46} + R_{48}}\right). \tag{1}$$

The charge on capacitor 44 is equal to +V minus the clamp potential applied to the first diode 36 minus the voltage drop across the second diode 38. Thus, if +V=+6 VDC, as in a preferred embodiment, and the diode drop across each of the first and second diodes is 0.7 VDC, the charge on the capacitor 44 is given by the following expression:

$$Q_{C44} = (6 - 0.7 - 0.7)\ VDC \tag{2}$$

$$= 4.6\ VDC.$$

This provides the maximum charge on capacitor 44 and corresponds to the situation where the value of the variable resistor 40 is essentially set to a value of 0 by coupling the second diode 38 to the left hand portion of resistor 40 as shown in the FIGURE. This minimizes the value of resistor 40 in the pulse width control 18, with the voltage to which the capacitor 44 is charged and hence the output pulse width determined entirely be the value of +V and the voltage drops across the first and second diodes 36 and 38.

For the case where the value of resistor 40 is increased to its maximum value by coupling the second diode 38 to the right hand portion thereof, the charge on capacitor 44 is given by the following expression, where +V=+6 VDC:

$$Q_{C44} = 6 - V_{CLAMP} - V_{D36} - V_{D38}, \tag{3}$$

$$= 6 - \left(\frac{6R_{40}}{R_{40} + R_{42}}\right) - 0.7 - 0.7, \tag{4}$$

$$= 4.6 - \left(\frac{6R_{40}}{R_{40} + R_{42}}\right). \tag{5}$$

From equations (2) and (5), it can be seen that the charge on capacitor 44 may be controlled by selecting the value of variable resistor 40 as desired. By thus adjusting the value of resistor 40 and the charge on capacitor 44, the amplitude of the output pulse provided from the output stage 22 via terminal 24 to the horizontal drive circuit 54 may be established as desired. Thus, varying the pulse width of the output of the monostable multivibrator 10 to the horizontal drive circuit 54 is accomplished not by changing the time constant of the timing circuit 20 therein, but rather the output of the monostable vibrator is varied by controlling the charge on capacitor 44. This ensures a linear discharge rate of the timing circuit 20 and eliminates variation in the timing of the output pulse provided to the horizontal drive circuit 54 caused by variations in the discharge rate, or time constant, of the RC circuit comprised of resistors 46, 48 and capacitor 44.

As shown in the FIGURE, resistor 42 may also be variable in order to permit the duty cycle of the monostable multivibrator 10 to be adjusted as desired. By changing the value of resistor 42 over a predetermined range, the duty cycle of the output pulse provided to the horizontal drive circuit 54 may be varied over a range of from approximately 1% to 90%. In addition, stepwise changes in the duty cycle of the output pulse of the monostable multivibrator 10 may be obtained by merely changing resistor 42 for another resistor having an appropriate resistance value, where resistor 42 has a fixed value. From equation (5), it can be seen that the output pulse duty cycle may be reduced by reducing the value of resistor 42. Similarly, by increasing the value of resistor 42, the duty cycle of the output pulse of the monostable multivibrator 10 to the horizontal drive circuit 54 may be increased as desired.

In a preferred embodiment, the various components of the monostable multivibrator 10 when used in the horizontal deflection system of a raster-scanned cathode ray tube are assigned the following values:

| Element | Value |
|---|---|
| C26 | 120 Picofarads |
| R28 | 2.2 Kilohms |
| R30 | 1.0 Kilohms |
| C34 | 0.0033 Microfarads |
| R40 | 25 Kilohms |
| R42 | 47 Kilohms |
| C44 | 0.0015 Microfarads |
| R46 | 56 Kilohms |
| R48 | 27 Kilohms |
| R52 | 1 Kilohms |

There has thus been shown an arrangement for more accurately controlling a timed output signal from a monostable multivibrator relative to an input signal provided thereto. Although having application in a wide variety of systems and environments, the monostable multivibrator of the present invention is particularly adapted for use with horizontal drive circuitry in a raster scanned cathode ray tube for the purpose of synchronizing electron beam scan of the CRT with received sync pulses. The time constant of an RC timing circuit in the multivibrator is maintained constant, while the extent of capacitor charging and discharging is regulated by means of a single control for controlling output pulse timing. Output pulse duty cycle may also be precisely controlled by means of another, separate control input.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. A variable, non-feedback type monostable multivibrator responsive to an input signal for generating an output signal in a predetermined time relation thereto, said variable monostable multivibrator comprising:
   differentiation means responsive to said input signal for generating a trigger pulse in response thereto;
   pulse width control means and a chargeable timing means having a characteristic time constant coupled to said differentiation means and responsive to said trigger pulse for generating a charging pulse, wherein said control means includes means for adjusting the pulse width of said charging pulse; and
   output means for receiving said charging pulse from said timing means and for generating said output signal in said predetermined timed relation to said input signal wherein the duration of said output signal is controlled by the pulse width of said charging pulse rather than the characteristic time constant of said timing means.

2. A monostable multivibrator in accordance with claim 1 wherein said pulse width control means includes the combination of a clamping diode and a grounded first variable resistor.

3. A monostable multivibrator in accordance with claim 1 wherein said pulse width control means further includes a second variable resistor coupled to a voltage source and to the combination of said clamping diode and said first variable resistor.

4. A monostable multivibrator in accordance with claim 1 wherein said differentiation means is responsive to a leading edge of the input signal.

5. A monostable multivibrator in accordance with claim 1 further comprising an inverter amplifier coupled between said differentiation means and said pulse width control means.

6. A monostable multivibrator in accordance with claim 1 wherein said chargeable timing means includes an RC timing circuit having said characteristic time constant characterized by a constant discharge rate.

7. A monostable multivibrator in accordance with claim 1 wherein said monostable multivibrator is in a raster scanned video display system and said input signal is a horizontal synchronization pulse provided thereto.

8. A monostable multivibrator in accordance with claim 7 wherein said video display system comprises a television receiver.

* * * * *